United States Patent [19]

Frese et al.

[11] Patent Number: 5,198,769
[45] Date of Patent: Mar. 30, 1993

[54] TESSERAL GRADIENT COIL FOR A NUCLEAR MAGNETIC RESONANCE TOMOGRAPHY APPARATUS

[75] Inventors: Georg Frese, Herzogenaurach; Eckart Stetter, Erlangen, both of Fed. Rep. of Germany

[73] Assignee: Siemens Aktiengesellschaft, Munich

[21] Appl. No.: 586,875

[22] Filed: Sep. 24, 1990

[30] Foreign Application Priority Data

Sep. 29, 1989 [EP] European Pat. Off. ........ 89118095.2

[51] Int. Cl.$^5$ ............................................ G01R 33/20
[52] U.S. Cl. .................................... 324/318; 336/224
[58] Field of Search ............... 324/318, 322, 309, 319; 336/224, 225, 228; 335/299, 296

[56] References Cited

U.S. PATENT DOCUMENTS

| | | | |
|---|---|---|---|
| 4,339,718 | 7/1982 | Bull et al. | 324/319 |
| 4,486,711 | 12/1984 | Frese et al. | 324/318 |
| 4,617,516 | 10/1986 | Schenck | 324/309 |
| 4,680,565 | 7/1987 | Jahnke | 335/299 |
| 4,755,755 | 7/1988 | Carlson | 324/319 |
| 4,767,993 | 8/1988 | Hanawa | 324/322 |
| 4,769,623 | 8/1988 | Marsing et al. | 335/299 |
| 4,794,338 | 11/1988 | Roemer et al. | 324/318 |
| 5,012,192 | 5/1991 | Siebold | 324/318 |

FOREIGN PATENT DOCUMENTS

| | | |
|---|---|---|
| 0216590 | 9/1986 | European Pat. Off. . |
| 0304126 | 8/1988 | European Pat. Off. . |
| 0304127 | 2/1989 | European Pat. Off. ........... 324/318 |
| 1176755 | 7/1964 | Fed. Rep. of Germany ...... 335/296 |
| 2316049 | 10/1974 | Fed. Rep. of Germany ...... 335/299 |
| 3732660 | 9/1986 | Fed. Rep. of Germany . |
| 8903031 | 9/1988 | PCT Int'l Appl. . |
| 2202333 | 9/1988 | United Kingdom ................ 324/318 |

OTHER PUBLICATIONS

"Magnetic Field Gradient Coils for NMR Imaging", Bangert et al. J. Phys. E. Sci. Instrum., vol. 15, 1982 pp. 235-239.

Primary Examiner—Michael J. Tokar
Assistant Examiner—Raymond Y. Mah
Attorney, Agent, or Firm—Hill, Steadman & Simpson

[57] ABSTRACT

A tesseral gradient coil for use in a nuclear magnetic resonance tomography apparatus is disposed in the hollow-cylindrical interior of the magnet system which generates the fundamental magnetic field, with one segment of each turn of the gradient coil lying on a small radius and one segment lying on a large radius, with reference to the cylinder access. The parasitic magnetic field which is unavoidably generated by the gradient coil, and which induces currents in the examination subject and in the cryostat of the fundamental field magnet system, is significantly reduced by this coil arrangement. The structure of the gradient coil is particularly suitable for use in the echo planar method, wherein the gradients must be switched rapidly and induced currents are therefore especially disturbing.

8 Claims, 5 Drawing Sheets

TESSERAL GRADIENT COIL FOR A NUCLEAR MAGNETIC RESONANCE TOMOGRAPHY APPARATUS

BACKGROUND OF THE INVENTION

1. Field of the Invention

The present invention is directed to a tesseral gradient coil for use in a nuclear magnetic resonance tomography apparatus of the type having a fundamental field magnet system with a hollow-cylindrical interior having a central axis in the z-direction of a Cartesian x-y-z coordinate system.

2. Description of the Prior Art

Gradient coils are known in the art for use in nuclear magnetic resonance tomography devices, the coils being disposed in the hollow-cylindrical interior of the fundamental field magnet system of the apparatus. It is known to provide a tesseral gradient coil which includes two segments proceeding in the azimuthal direction and conductors connecting these segments. Such a gradient coil is described, for example, in European application 0 073 402 corresponding to U.S. Pat. No. 4,486,711. This known gradient coil consists of a plurality of saddle-shaped individual coils arranged on a cylindrical carrier, the longitudinal axis of the cylindrical carrier usually being referred to as the z-direction. Three gradient directions are required for nuclear magnetic resonance tomography, namely in the x-direction, y-direction and z-direction of a Cartesian coordinate system. Those gradient coils which generate magnetic field gradients in a direction perpendicular to the longitudinal cylinder axis, i.e. in the x-direction and the y-direction, are referred to as tesseral gradient coils.

A gradient coil system is disclosed in European application 0 216 590 wherein saddle coils which generate the useful field for the gradients are arranged on a first imaginary cylindrical surface. Further saddle coils which compensate the field of the gradient coils in the outward direction are arranged on a second imaginary cylindrical surface having a larger diameter. The currents induced in the cold shield of the fundamental field magnet caused by a field change of the gradient coils are thus considerably reduced. These currents are disturbing, particularly given gradients which are rapidly switched.

Gradients which are rapidly switched are needed, in particular, in a method of operating a nuclear magnetic resonance tomography apparatus known as the echo planar method. After a single excitation, a gradient field is reversed in polarity until the measured data for a complete slice of the examination subject are obtained. Because this must occur before the nuclear magnetic resonance signal has decayed, short switching times are necessary. The fast flux change dB/dt required for this purpose induces currents not only in the cold shield of the fundamental field magnet system which surrounds the gradient coils, but also induces currents in the examination subject. In the extreme case, the currents induced in this manner may stimulate a patient's nerves and may be physiologically unpleasant.

In conventional tesseral gradient coils, the useful field, functioning to generate magnetic field gradients, is lower than a parasitic magnetic field which is unavoidably also generated, so that the induced currents essentially derive from the parasitic magnetic field.

SUMMARY OF THE INVENTION

It is an object of the present invention to provide a tesseral gradient coil for use in a nuclear magnetic resonance tomography apparatus wherein parasitic magnetic fields, i.e., magnetic fields which cannot be used for generating a gradient field, are reduced and thus the currents induced by the gradient coil in the examination subject and in the structure surrounding the gradient coil, given field changes, are reduced.

The above object is achieved in accordance with the principles of the present invention in a tesseral gradient coil wherein one of the two segments allocated to each turn, and proceeding azimuthally, lies on an optimally small radius, and the other segment lies on an optimally large radius, with reference to the cylinder axis. The parasitic magnetic field components generated by the gradient coil in the radial direction, and thus the induced currents, are thereby reduced.

The area surrounded by the gradient coil, and thus the inductivity, becomes smaller, so that short switching times can be achieved with lower outlay. As a result of the small coil expanse, the conductor length required for the turns also is shortened, and thus has a low ohmic resistance. The Lorentz forces act radially and antiparallel on the segments, so that the individual forces on the two segments of a turn substantially cancel. Given suitable support of the segments against one another, this results in fewer mechanical oscillations, and a reduction in noise.

To homogenize a gradient field in a larger region, each gradient coil may consist of a plurality of axially spaced turns. The distance between the individual turns in the axial direction can be varied from turn-to-turn, so that the homogeneity can be influenced by the spacing of the turns.

A minimization of the parasitic radial field components is achieved if the segments allocated to a turn lie in the same axial plane. Therefore, if the segments allocated to a turn are axially offset relative to each other to achieve the aforementioned improved homogeneity, it must be borne in mind that the parasitic radial magnetic field component increases with the amount of axial offset.

An optimization of the homogeneity can also be achieved by disposing the segments to describe different angles, for example, having the outer and inner segment each describe a different angle, or having different turns describe different angles.

In a further embodiment of the invention, one portion of the turns of the gradient coil can be arranged on a cylindrical surface which is concentric with the hollow-cylindrical examination space. In this embodiment, eddy currents in the cryostat will be particularly reduced if the coil has the same number of turns as the number of outer segments required for the active shielding.

An improved linearity of the gradient field can be achieved in an embodiment wherein the conductors connecting the segments each form a loop extending in the z-direction. The linearity disturbing effect of these conductors is thus displaced outwardly from the examination volume.

DESCRIPTION OF THE PREFERRED EMBODIMENTS

Figure 1:
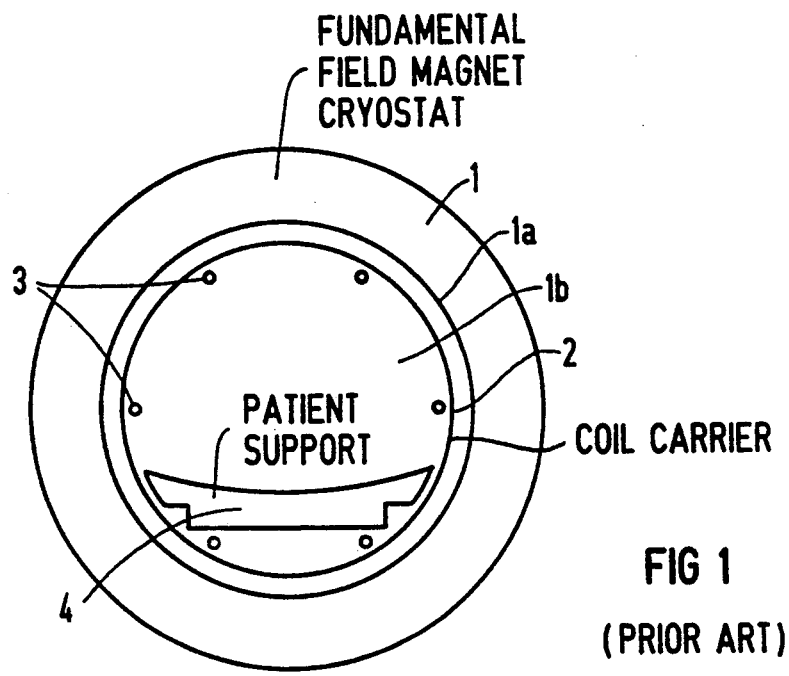
FIG. 1 is an end elevational view of a conventional magnetic resonance imaging tomography apparatus of the type in Which the tesseral gradient coil disclosed herein can be used.

The basic components of a conventional nuclear magnetic resonance tomography apparatus, necessary for explaining the invention disclosed herein, are schematically shown in FIG. 1. The apparatus includes a superconducting fundamental field magnet system for generating the fundamental magnetic field. The coils required for this purpose (not separately shown in FIG. 1) are contained in a cylindrical cryostat 1. The cryostat 1 has a cylindrical interior 1b. A hollow-cylindrical carrier member 2 for gradient coils is arranged in the interior 1b. A RF antenna, which is formed by rods 3 in the exemplary embodiment, is disposed inside the carrier member 2. A patient support 4 is also disposed inside the carrier member 2. Further elements which are usually present in a nuclear magnetic resonance tomography apparatus, for example shim devices, are not shown in Figure because they are not necessary for an explanation of the invention.

Figure 2:
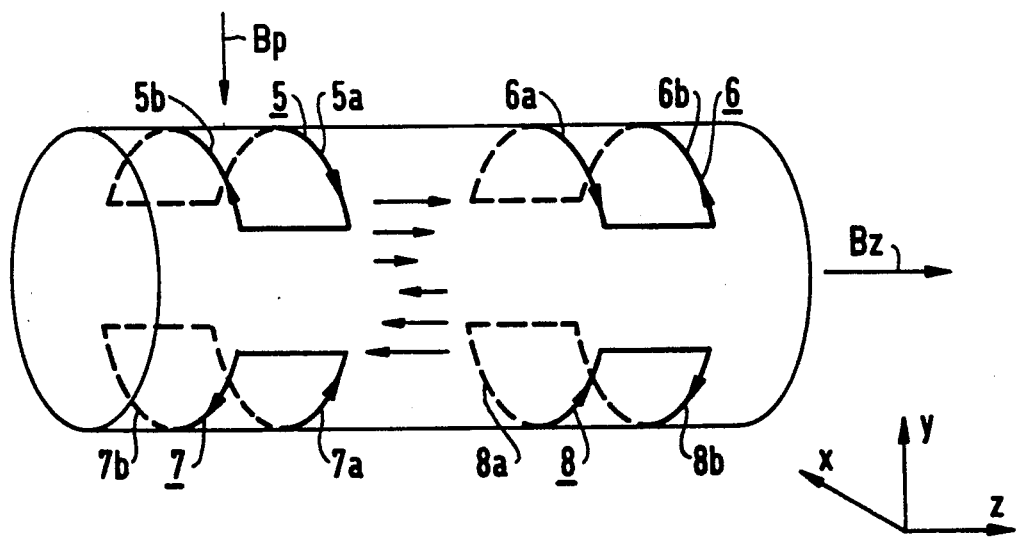
FIGS. 2 and 3 are schematic, perspective views of conventional gradient coils in the form of saddle coils.

For explaining the problem solved by the gradient coil arrangement disclosed herein, a known gradient coil system is shown in FIG. 2, for generating a magnetic field gradient in the y-direction. As noted earlier, magnetic field gradients in the x-, y- and z-directions, which are orthogonal, correspond to the coordinate axis shown in FIG. 2 and are required in magnetic resonance imaging devices. The z-direction is defined as the direction of the fundamental magnetic field $B_z$, i.e., along the longitudinal axis of the hollow-cylindrical interior. The gradient coils which serve the purpose of generating magnetic field gradients perpendicular to this z-axis are referred to as tesseral gradient coils.

The gradient coil arrangement disclosed herein is directed only to tesseral coils, so that the gradient coils which generate the magnetic field in the z-direction, and which can be simply executed as windings on the carrier member 2, are omitted for clarity.

FIG. 2 shows only the gradient coil system of a conventional type for generating a magnetic field gradient in the y-direction. The gradient coil system consists of four individual saddle coils 5, 6, 7 and 8. The inner arcs 5a, 6a, 7a and 8a of the saddle coils essentially contribute to generating the magnetic field in the y-direction, referred to below as the y-gradient. The outer arcs 5b, 6b, 7b and 8b are disposed outside of the examination space. The action of the inner arcs 5a through 8a on the magnetic field in the examination region is identified with arrows in FIG. 2. An intensification of the fundamental field $B_z$ occurs in the upper portion of the examination region and an attenuation of the fundamental field $B_z$ occurs in the lower portion, so that a magnetic field gradient arises in the y-direction.

For generating a magnetic field gradient in the x-direction, the same coil arrangement is provided rotated by 90° around the cylinder axis, however, this is not shown in FIG. 2 for clarity.

This known gradient coil arrangement has the advantage that it can be constructed extremely flat, however, it generates a strong, parasitic magnetic field component $B_p$ in the radial direction, which is stronger than the usable magnetic field component in the z-direction. Due to this parasitic magnetic field $B_p$, currents are induced in the inside wall of the cryostat and in the examination subject, given changes in current, to a greater degree than as a result of the useful field. These induced currents have an increasingly disturbing effect as the change in current becomes greater and thus as the flux change $dB/dt$ becomes greater. Such changes particularly occur in imaging according to the echo planar method.

Figure 3:
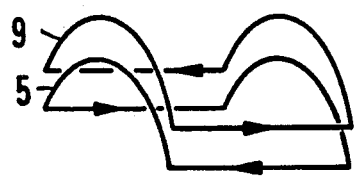

To reduce the currents induced in the inside wall of the cryostat, it is known from the aforementioned European application 0 216 590 to provide a gradient coil with an active shielding. Such an arrangement is schematically shown in FIG. 3. Two saddle coils 5 and 9 lie on two concentric cylindrical surfaces. The saddle coils 5 and 9 are traversed by current in opposite directions. The inner saddle coil 5 generates the useful field for the magnetic field gradient, and the saddle coil 9 compensates the magnetic field of the saddle coil 5 in the outward direction. In such an arrangement, however, twice the number of coils is required, and the outer saddle coil 9 also attenuates the useful field of the inner saddle coil 5.

Figure 4:
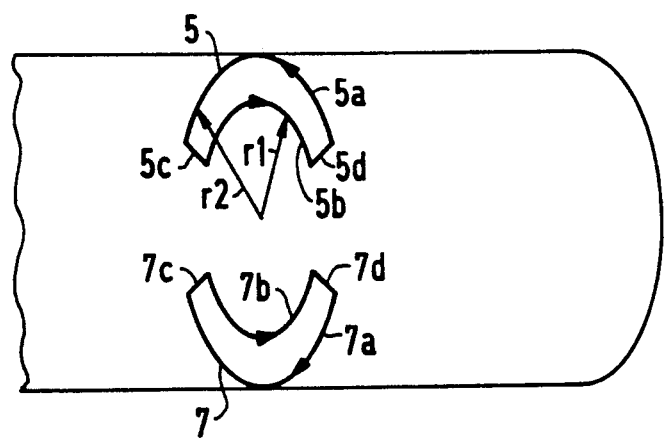
FIG. 4 shows a basic arrangement of a tesseral gradient coil constructed in accordance with the principles of the present invention in perspective view.

A first exemplary embodiment of the invention is shown in FIG. 4. FIG. 4 shows only the two right gradient coils 5 and 7 of the gradient coil system for the y-direction. The turns of these gradient coils lie in a plane perpendicular to the longitudinal axis. The coil 5 has two segments 5a and 5b which respectively lie on different radii with respect to the longitudinal cylinder axis. The coil 7 has similar segments 7a and 7b. The inner segments 5b and 7b are disposed on an optimally small radius r1, which is limited by the necessary diameter of the examination space. The outer segments 5a and 7a are arranged on an optimally large radius r2, which is structurally limited by the inside diameter of the cryostat 1, or by a shim means (not shown) which may be arranged at the inside wall of the cryostat 1. The connecting conductors 5c and 5d, and 7c and 7d, between the segments 5a and 5b, and 7a and 7b, lie in the radial direction. In contrast to the conventional structures shown in FIGS. 2 and 3, the coil axis of the gradient coil of FIG. 4 does not extend in the radial direction, but instead extends in the axial direction. The parasitic, radial field component is therefore significantly lower. The currents induced in the cryostat 1 and in the examination subject due to field changes are thus also lower. Favorable eddy current behavior is achieved and physiological effects are noticeably reduced, which are particularly advantageous given extremely short switching times of the gradients. Because gradient coils having this structure enclose an extremely small area, they have a lower inductivity and a lower energy storage. The ohmic resistance of the turns also is low because of the short line lengths. Lower demands are made on the gradient power supply as a consequence of these factors.

The Lorentz forces act radially and antiparallel on the segments 5a and 5b, and 7a and 7b. Lower total forces therefore arise in the aggregate in the magnetic field, so that mechanical vibrations can be structurally damped in a simple manner, and the noise caused by the gradient circuit can thus be noticeably reduced.

Figure 5:
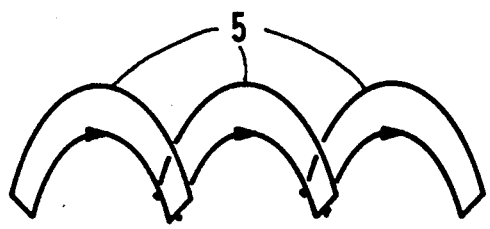
FIGS. 5 through 11 show various further embodiments of gradient coils constructed in accordance with the principles of the present invention.
Figure 5:
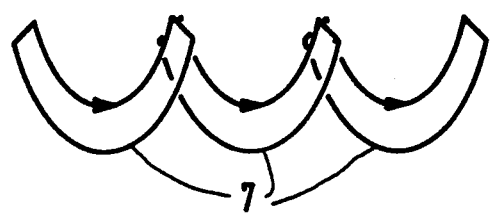

Various measures can be undertaken to improve the homogeneity of the gradient field. As shown in FIG. 5, for example, a plurality of gradient coils 5 and 7 (three in the exemplary embodiment) are arranged axially spaced from one another.

Figure 6:
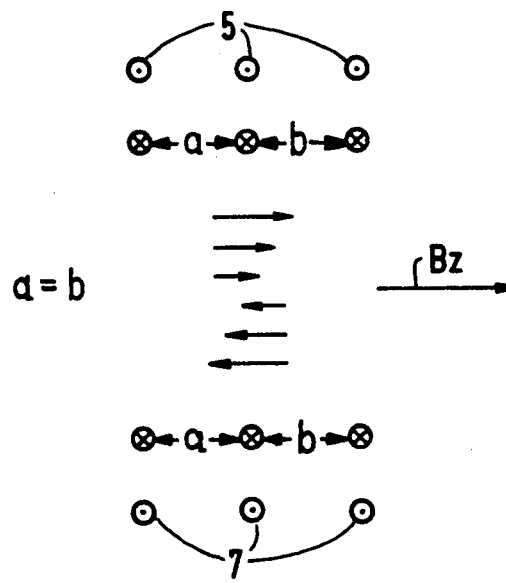

FIG. 6 shows the embodiment of FIG. 5 in side view, wherein the effect on the fundamental field $B_z$ is symbolized by arrows. The gradient field can be homogenized over a longer examination region with such an arrangement.

Figure 7:
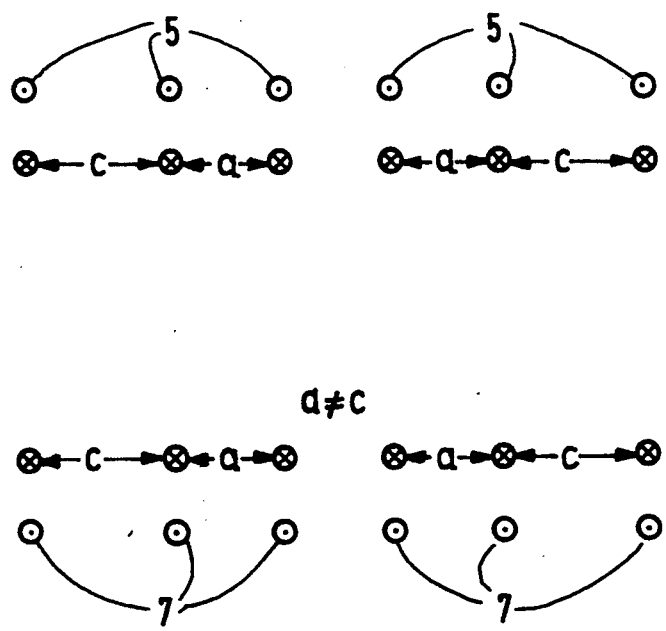

As shown in FIG. 6, the individual turns have an identical spacing (a=b) in the axial direction. Under certain circumstances, however, an even more linear gradient field can be achieved if the 11 spacing of the turns is varied, (a=c) as shown in FIG. 7.

Figure 8:
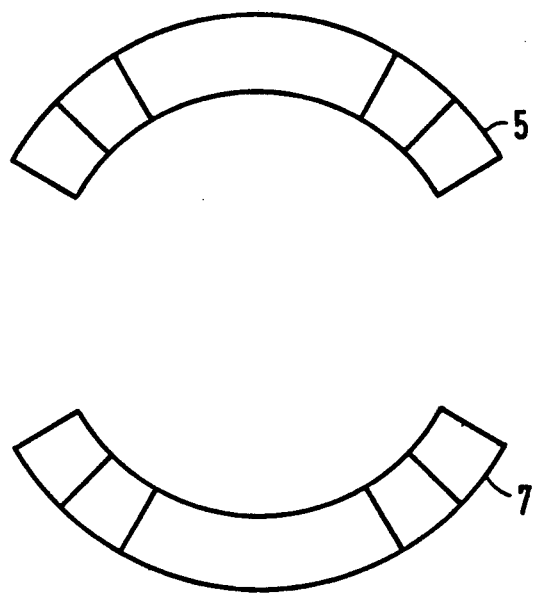
Figure 9:
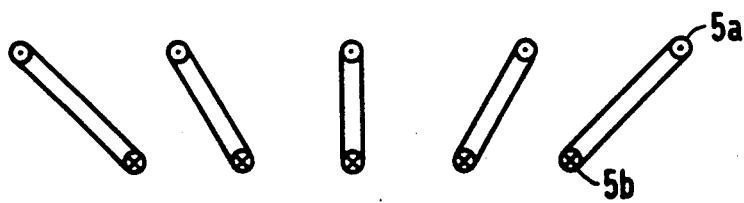
Figure 9:
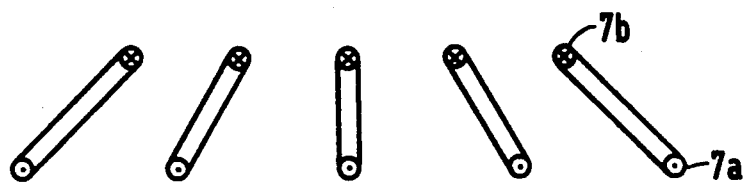

Further possibilities for influencing the linearity of the gradient field are shown in FIGS. 8 and 9. As shown in FIG. 8, the turns of each gradient coil 5 and 7 describe a different radial angle. As shown in FIG. 9, the inner and outer segments 5a and 5b, or 7a and 7b, are spaced from each other in the radial direction. Although t-he parasitic field component in the radial direction is thus somewhat increased, the homogeneity of the gradient field is improved as a trade-off.

Figure 10:
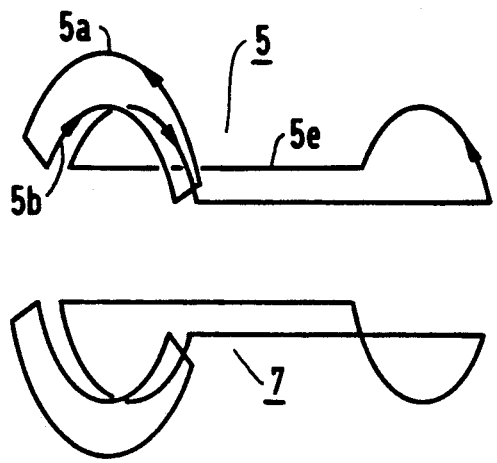

A combination of the principle of a conventional saddle coil with the principles of the present invention is shown in FIG. 10, for an individual gradient coil. The outer segment 5a is provided with only as many turns as is optimum for the shielding toward the exterior in the proximity of the examination space, with all other turns 5e lying on a cylindrical surface with the inner segment 5b, as in a conventional saddle coil.

Figure 11:
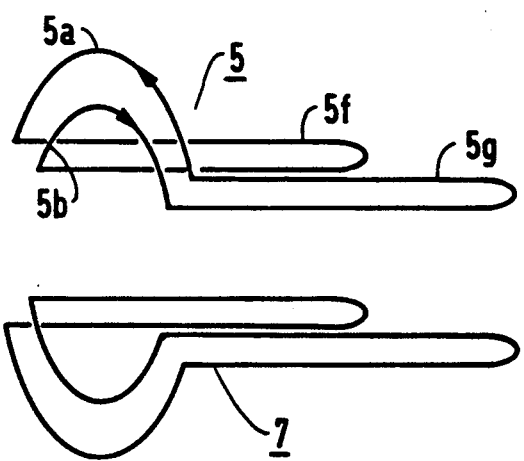

FIG. 11 shows a further exemplary embodiment of the invention for improved linearity of the gradient field. Each turn consists of an inner segment 5b and an outer segment 5a. The two segments 5a and 5b are connected by conductor loops 5f and 5g which extend in the direction of the cylinder axis.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a nuclear magnetic resonance tomography apparatus having a fundamental field magnet system having a hollow-cylindrical interior with a cylinder axis disposed in the z-direction of a Cartesian x-y-z coordinate system, the improvement of a tesseral gradient coil comprising:

two segments proceeding in the azimuthal direction connected by conductors, with a first of said azimuthally proceeding segments being disposed on an optimally small radius and a second of said azimuthally proceeding segments disposed on an optimally large radius with respect to said cylinder axis, said segments being disposed in respective planes substantially perpendicular to said cylinder axis.

2. A tesseral gradient coil as claimed in claim 1 further comprising a plurality of turns each including two of said segments connected by said conductors, said turns being axially spaced from one another.

3. A tesseral gradient coil as claimed in claim 2 wherein said axial spacing between said turns is not constant.

4. A tesseral gradient coil as claimed in claim 1 wherein said two segments connected by said conductors form a turn, and wherein said respective planes in which said segments are disposed coincide.

5. A tesseral gradient coil as claimed in claim 1 wherein said two segments connected by said conductors form a turn, and wherein the segments in a turn are axially spaced relative to each other.

6. A tesseral gradient coil as claimed in claim 1 wherein said segments describe different radial angles.

7. A tesseral gradient coil as claimed in claim 1 wherein said segments form a part of a turn, and wherein said turn has a further portion arranged on an imaginary cylindrical surface which is concentric with said hollow-cylindrical interior.

8. A tesseral gradient coil as claimed in claim 1 wherein said conductors each form an open loop extending in said z-direction.

* * * * *